(12) United States Patent
Takizawa et al.

(10) Patent No.: US 8,748,939 B2
(45) Date of Patent: Jun. 10, 2014

(54) TRANSISTOR AND METHOD FOR MANUFACTURING SAME

(75) Inventors: Toshiyuki Takizawa, Kyoto (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/567,503

(22) Filed: Aug. 6, 2012

(65) Prior Publication Data

US 2012/0299059 A1 Nov. 29, 2012

Related U.S. Application Data

(63) Continuation of application No. PCT/JP2010/005274, filed on Aug. 26, 2010.

(30) Foreign Application Priority Data

Mar. 25, 2010 (JP) ................................. 2010-070480

(51) Int. Cl.
*H01L 31/102* (2006.01)

(52) U.S. Cl.
USPC .......................................... 257/189; 257/190

(58) Field of Classification Search
USPC ............ 257/189, 190, 194, E29.255, E21.09, 257/E29.089; 438/478
See application file for complete search history.

(56) References Cited

U.S. PATENT DOCUMENTS

| | | | |
|---|---|---|---|
| 5,306,924 A * | 4/1994 | Usami et al. ..................... 257/18 |
| 5,311,035 A * | 5/1994 | Nire ................................ 257/15 |
| 2004/0124434 A1 | 7/2004 | D'Evelyn et al. | |
| 2005/0009310 A1 | 1/2005 | Vaudo et al. | |
| 2005/0274977 A1 * | 12/2005 | Saito et al. ..................... 257/192 |
| 2006/0118820 A1 * | 6/2006 | Gaska et al. ................... 257/189 |
| 2007/0138505 A1 | 6/2007 | Preble et al. | |
| 2007/0141823 A1 | 6/2007 | Preble et al. | |
| 2008/0197359 A1 | 8/2008 | Imanishi et al. | |
| 2009/0042345 A1 * | 2/2009 | Saxler et al. ................... 438/172 |
| 2009/0095976 A1 * | 4/2009 | Song et al. ..................... 257/103 |
| 2009/0174038 A1 * | 7/2009 | Wang ............................. 257/618 |
| 2010/0117118 A1 * | 5/2010 | Dabiran et al. ............... 257/190 |
| 2011/0037101 A1 | 2/2011 | Nakazawa et al. | |

FOREIGN PATENT DOCUMENTS

| | | |
|---|---|---|
| JP | 2004-345868 A | 12/2004 |
| JP | 2006-278857 A | 10/2006 |

(Continued)

OTHER PUBLICATIONS

International Search Report issued in International Patent Application No. PCT/JP2010/005274 dated Nov. 30, 2010.

(Continued)

*Primary Examiner* — Jarrett Stark
*Assistant Examiner* — Shahed Ahmed
(74) *Attorney, Agent, or Firm* — McDermott Will & Emery LLP

(57) ABSTRACT

The transistor includes an underlying layer 301 formed on a substrate 300, and a first layer (including an operation layer 302) made of a nitride semiconductor formed on the underlying layer 301. The underlying layer 301 is a multilayered structure including a plurality of stacked nitride semiconductor layers. The underlying layer 301 includes a transition-metal-containing layer containing at least one of cobalt, nickel, ruthenium, osmium, rhodium, or iridium which is a transition metal.

18 Claims, 12 Drawing Sheets

(56) References Cited

FOREIGN PATENT DOCUMENTS

| | | |
|---|---|---|
| JP | 2007-184379 A | 7/2007 |
| JP | 2007-184379 A | 7/2007 |
| JP | 2007-534580 A | 11/2007 |
| JP | 2008-277441 A | 11/2008 |
| JP | 2008-277441 A | 11/2008 |
| JP | 2009-519202 A | 5/2009 |

OTHER PUBLICATIONS

S. Heikman et al., "Growth of Fe doped semi-insulating GaN by metalorganic chemical vapor deposition," Applied Phyics Letters, vol. 81, No. 3, Jul. 15, 2002.

P. Muret et al., "Photoinduced current transient spectroscopy of deep levels and transport mechanisms in iron-doped GaN thin films grown by low pressure-metalorganic vapor phase epitaxy," Journal of Applied Physics 102, 053701 (2007).

\* cited by examiner

FIG.8

| 3 | 4 | 5 | 6 | 7 | 8 | 9 | 10 | 11 | 12 |
|---|---|---|---|---|---|---|---|---|---|
| Sc | Ti | V | Cr | Mn | Fe | Co | Ni | Cu | Zn |
| Y | Zr | Nb | Mo | Tc | Ru | Rh | Pd | Ag | Cd |
| (RE) | Hf | Ta | W | Re | Os | Ir | Pt | Au | Hg |

SUPERLATTICE LAYER | AlGaN LAYER

314 | 312B | 312A

TRANSISTOR AND METHOD FOR MANUFACTURING SAME

CROSS-REFERENCE TO RELATED APPLICATION

This is a continuation of PCT International Application PCT/JP2010/005274 filed on Aug. 26, 2010, which claims priority to Japanese Patent Application No. 2010-070480 filed on Mar. 25, 2010. The disclosures of these applications including the specifications, the drawings, and the claims are hereby incorporated by reference in their entirety.

BACKGROUND

The present disclosure relates to transistors and methods for fabricating the same, and specifically to a transistor including a nitride semiconductor and a method for fabricating the same.

Group III nitride semiconductors (hereinafter abbreviated to nitride semiconductors), such as gallium nitride (GaN), have wide band gaps and large breakdown electric fields. Thus, the nitride semiconductors are expected as new materials which are used in high-output transistors and have advantages over silicon (Si) and gallium arsenide (GaAs). The band gaps of the nitride semiconductors can be freely changed by changing a mixed crystal ratio. An AlGaN/GaN heterostructure is formed by an aluminum gallium nitride (AlGaN) layer and a gallium nitride (GaN) layer having different band gaps. In the AlGaN/GaN heterostructure, a charge is generated at a heterojunction on a (0001) plane of a crystal structure due to spontaneous polarization and piezo-polarization. Thus, even when layers are undoped, a sheet carrier density of $1 \times 10^{13}$ cm$^{-2}$ or higher can be obtained. Therefore, a heterojunction field effect transistor (HFET) using a charge generated at a heterojunction as a channel can achieve a high current density to increase output power.

There is a demand for increasing a breakdown voltage and output power of the HFET. In order to increase the breakdown voltage of the HFET, an underlying layer provided between a layer (for example, an operation layer) in which electrons or positive holes serving as carriers are transported and a substrate has to have high insulating properties. In a method for improving the insulating properties of the underlying layer, doping with a dopant for trapping carriers is performed in crystal growth of the underlying layer. As the dopant, iron (Fe), which is a transition metal, is generally used (see, for example, Japanese Translation of PCT International Application No. 2009-519202, Japanese Translation of PCT International Application No. 2007-534580, Japanese Patent Publication No. 2007-184379, and Sten Heikman, et al., Applied Physics Letters, Vol. 81, p. 439 (2002)).

SUMMARY

However, the method of improving the insulating properties of the underlying layer by doping with Fe has a problem where Fe contaminates layers other than the underlying layer. For example, after crystal growth of a Fe-introduced GaN layer is performed with Fe being supplied, the supplying Fe is stopped, and then crystal growth of an undoped GaN layer serving as a layer (for example, an operation layer) is performed. In this case, Fe also contaminates the undoped GaN layer. In particular, the undoped GaN layer has a very large amount of Fe contained within several hundred nanometers from an interface of the Fe-introduced GaN layer. As the distance from the interface of the Fe-introduced GaN layer increases, the amount of Fe contained in the undoped GaN layer decreases. However, the amount is not reduced to a background level. As described above, when an operation layer is formed on a Fe-doped underlying layer, Fe may contaminate the operation layer. Even when the amount of Fe contained in the operation layer is small, the Fe causes degradation of the performance of transistors. In particular, Fe contamination in the operation layer causes a so-called collapse phenomenon observed as a drain current slump in high-speed switching. When the collapse phenomenon occurs, on-resistance of the transistor significantly increases, which reduces power conversion efficiency, thereby increasing the amount of heat generation of the transistor. In a worst-case scenario, the transistor and a module including the transistor are broken.

In one general aspect, the present application describes a transistor including an underlying layer which has small influence on an operation layer and improved insulating properties.

An example transistor of the present disclosure includes an underlying layer containing a transition metal such as ruthenium having high controllability.

Specifically, the example transistor includes: a substrate; an underlying layer formed on the substrate; and a first layer made of a nitride semiconductor formed on the underlying layer, wherein the underlying layer is a multilayered structure including a plurality of stacked nitride semiconductor layers, and includes a transition-metal-containing layer containing at least one of cobalt, nickel, ruthenium, osmium, rhodium, or iridium which is a transition metal. For example, the first layer is composed of an operation layer.

In the example transistor, the underlying layer may include a superlattice layer, and the superlattice layer may be the transition-metal-containing layer. With this configuration, it is possible to allow the superlattice layer to be an insulating layer, where the conductivity of the superlattice layer would otherwise be significantly increased by carrier induction due to a polarization effect.

In the example transistor, the superlattice layer may include an AlN layer and a GaN layer, and may be a most strongly polarized layer in the multilayered structure.

In the example transistor, a layer in contact with an under surface of the superlattice layer may contain the transition metal within at least 0.1 μm from the under surface. With this configuration, due to a polarization effect of a superlattice, electrons induced in a layer directly under the superlattice can be efficiently trapped by the transition metal element, so that it is possible to allow the superlattice layer to be an insulating layer.

In the example transistor, a sub-layer of the superlattice layer which has a small lattice constant may contain the transition metal, and a sub-layer of the superlattice layer which has a large lattice constant may be free of the transition metal. With this configuration, since the transition metal has a larger atomic radius than the nitride semiconductor, substituting a Group-III site with the transition metal applies compression strain to a host material. Thus, selectively introducing the transition metal to a layer which has a small lattice constant and to which tensile strain is applied compared to other layers can compensate the compression strain caused by a difference in atomic radius. Moreover, doping with the transition metal can reduce the amount of strain.

In the example transistor, the underlying layer may include an AlGaN layer, and the AlGaN layer may be the transition-metal-containing layer.

In the example transistor, the multilayer structure preferably has an interface formed by two of the nitride semiconductor layers having different polarization properties, and at least one of the two layers forming the interface is preferably the transition-metal-containing layer. With this configuration, a trap level formed by the transition metal for trapping carriers generated by polarization effectively allows the underlying layer to be an insulating layer.

In the example transistor, at least one of the layers in the multilayer structure may be an AlGaN layer, and the AlGaN layer may be a most strongly polarized layer in the multilayer structure.

In the example transistor, the transition-metal-containing layer may be the AlGaN layer.

In the example transistor, the transition-metal-containing layer may have a higher carbon content than the other layers in the multilayer structure. When the nitride semiconductor is doped with carbon, a trap level is formed. This can further increase resistance.

In the example transistor, a layer provided above the transition-metal-containing layer are preferably free of the transition metal. With this configuration, it is possible to ensure a sufficient distance between a trap level formed by the transition metal and an electron conduction layer. Thus, breakdown voltage characteristics can be compatible with transistor characteristics.

In the example transistor, the transition metal may be introduced into the transition-metal-containing layer from a metallocene compound, the metallocene compound may have a structure sandwiching the transition metal between two pairs of cyclopentadienyl groups including an alkyl side chain, and the alkyl side chain may include two or more carbon atoms. With this configuration, it is possible to efficiently doping the nitride semiconductor layer with the transition metal, and additionally, to improve carbon concentration.

An example method for fabricating a transistor includes: forming an underlying layer on a substrate; and forming a first layer made of a nitride semiconductor on the underlying layer, wherein the forming the underlying layer includes forming a transition-metal-containing layer which is a nitride semiconductor layer containing at least one of cobalt, nickel, ruthenium, osmium, rhodium, or iridium which is a transition metal, and the forming the transition-metal-containing layer includes introducing the transition metal into the nitride semiconductor layer by thermally decomposing a metallocene compound, the metallocene compound has a structure sandwiching the transition metal between two pairs of cyclopentadienyl groups having an alkyl side chain, and the alkyl side chain includes two or more carbon atoms. For example, the first layer is composed of an operation layer.

In the example method, the metallocene compound may have a melting point lower than 50° C.

According to the transistor and the method for fabricating the same according to the present disclosure, it is possible to obtain a transistor including an underlying layer which has small influence on a first layer and has improved insulating properties.

BRIEF DESCRIPTION OF THE DRAWINGS

FIG. 8 is a periodic table of the transition metals.

DETAILED DESCRIPTION

Figure 1A:
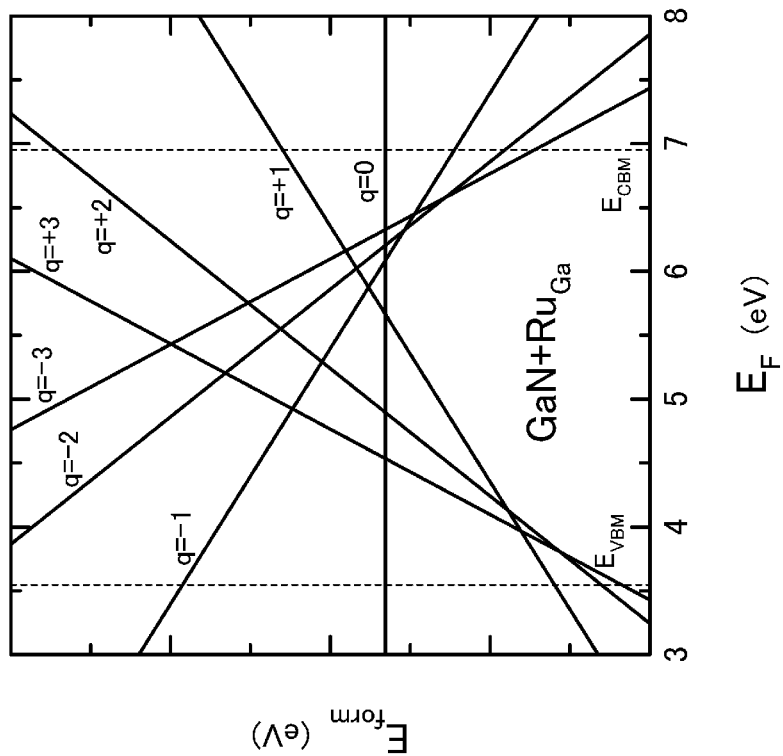
FIG. 1A is a graph illustrating an electron state with a Ga site is substituted with iron.

First, a principle of obtaining an underlying layer having small influence on a first layer (for example, including an operation layer) and having improved insulating properties found by the inventors of the present application will be described. The present inventors found physical properties of ruthenium (Ru)-doped GaN which had not been reported. First, an electronic structure of the Ru-doped GaN obtained by a first-principles calculation will be described.

Formation energy $E_{form}$ of transition-metal-doped GaN can be expressed by Expression 1. In Expression 1, q is the electron number in a system of reaction, $E_{total}$ is overall energy obtained by the first-principles calculation, and $n_i$ and $\mu_i$ respectively mean the number and chemical potential of an atom i (where i is any one of Ga, N, or a transition metal element). $E_F$ is Fermi level whose possible value is within a band gap.

[Expression 1]

$$E_{form}(q) = E_{total}(q) - n_{Ga}\mu_{Ga} - n_N\mu_N - n_{TM}\mu_{TM} + qE_F \qquad (1)$$

GaN is in a state of equilibrium, and the number of atoms does not increase or decrease. Thus, a sum of chemical potential $\mu_{Ga}$ of Ga and chemical potential $\mu_N$ of N is equal to chemical potential $\mu_{GaN(bulk)}$ of bulk GaN. Thus, Expression 2 holds true.

[Expression 2]

$$\mu_{Ga} + \mu_N = \mu_{GaN(bulk)} \qquad (2)$$

Moreover, as expressed by Expression 3, when the chemical potential $\mu_N$ of N is in an extreme state (a nitride-rich extreme) $\mu N_{2(molecule)}$ in which an N molecule is formed, the chemical potential $\mu_{Ga}$ of Ga has a minimum value based on the relationship between Expression 3 and Expression 2.

Here, Ga is most easily extracted from a GaN crystal, and when the system is doped with a transition metal, the transition metal substitutes for a Ga site on a priority basis.

[Expression 3]

$$\mu_N = \mu_{N_2(molecule)} \quad (3)$$

Moreover, when chemical potential $\mu_{TM}$ of the transition metal element is expressed by Expression 4, the transition metal element is most easily deposited as a simple metal.

[Expression 4]

$$\mu_{TM} = \mu_{TM(metal)} \quad (4)$$

Based on the above expressions, the formation energy $E_{form}$ of the transition-metal-doped GaN was computed. In the computation, a 3×3×2 72-atom GaN super cell was considered to be a starting point, and only one Ga atom was substituted with a transition metal atom. In structure relaxation of the super cell, a cell size was designed to be invariable in consideration of a small amount of the transition metal with which GaN bulk is doped. Subjects of the structure relaxation were also set to range from a transition metal element to a second nearest neighbor atom. The electron number in a charge neutral state is given by the following expression: 35×13 (including semicore 3d electrons of the Ga atom)+ 36×5 (only the L shell of the N atom)+8 (the outermost shell s and the d orbital of the transition metal atom)=643. From this state, the electron number q was changed in the range from −3 to +3, and in doing so, the overall energy $E_{total}$ of the system was obtained. Further, the formation energy $E_{form}$ in each of charge states in which q took on values from −3 to +3 was obtained. Moreover, as the transition metal atom, Fe and Ru were used in the computation.

Figure 1B:
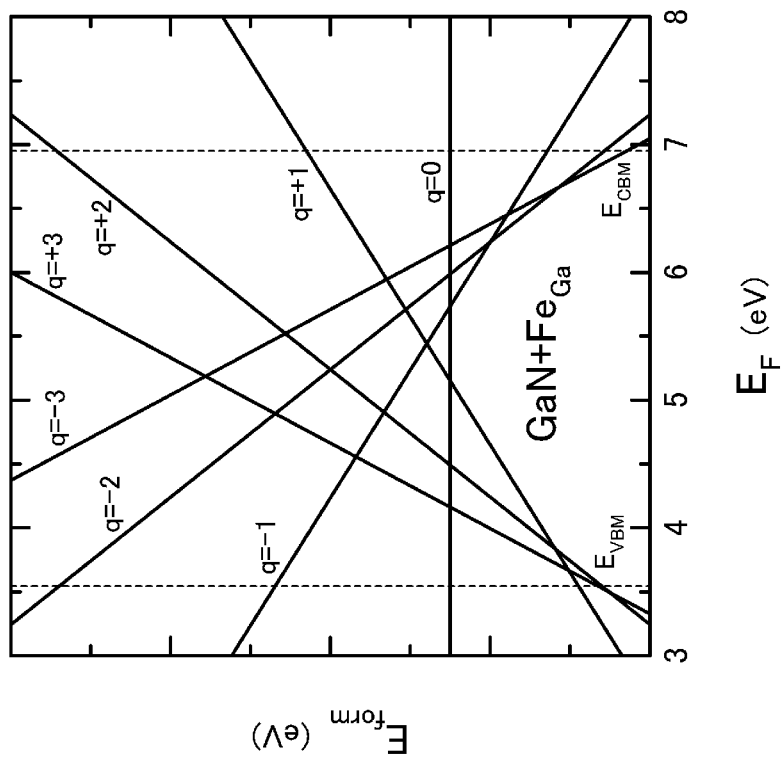
FIG. 1B is a graph illustrating an electron state with a Ga site is substituted with ruthenium.

FIG. 1A illustrates an electron state when Fe substitutes for a Ga site, and FIG. 1B illustrates an electron state when Ru substitutes for a Ga site. In FIGS. 1A and 1B, the formation energy in each of the charge states is plotted as a function of the Fermi level. Since the number of atoms does not change in each of computation models, the formation energy of a charge neutrality condition (q=0) is considered to be a starting point. Moreover, a charge state in which minimum energy with respect to the Fermi level is obtained is most stable, and means an electron state which can be established in the state of equilibrium. As illustrated in FIGS. 1A and 1B, when the Fermi level changes, the most stable charge state changes. As the Fermi level increases from an upper end ($E_{CBM}$) of a valence band, a most stable valence gradually decreases. The intersection of a plot indicating the most stable charge state with a plot indicating another charge state is a point at which the most stable valence changes by one, and the intersection means a trap level. Based on the above-described understanding, impurity levels of Fe and Ru within the forbidden band of GaN were obtained.

Figure 2:
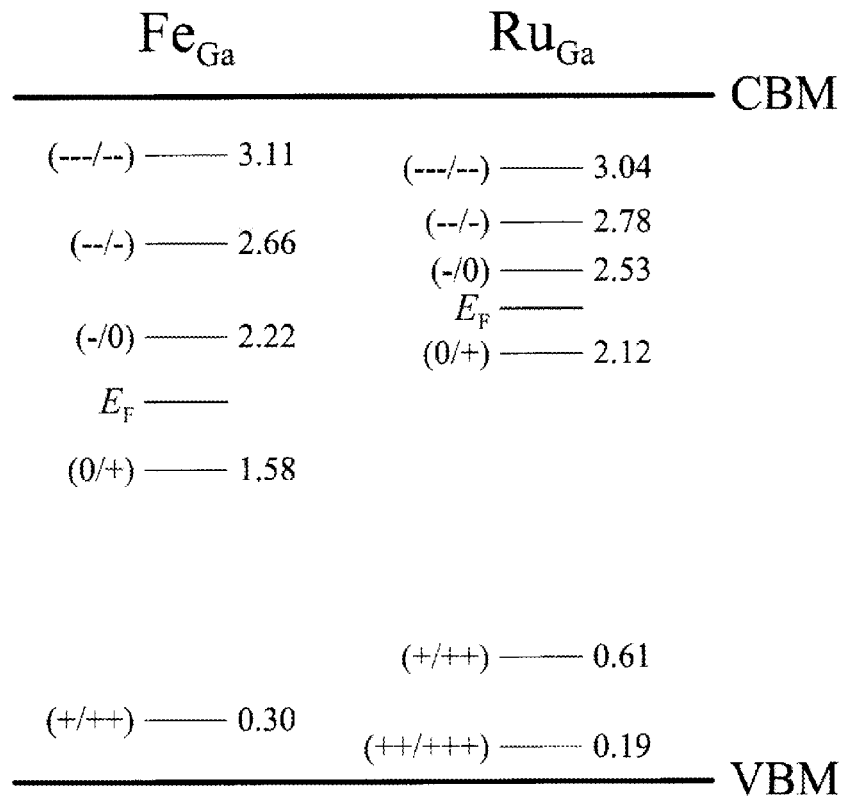
FIG. 2 is a plot illustrating trap levels of Fe-doped GaN and Ru-doped GaN.

FIG. 2 illustrates results obtained by plotting trap levels of Fe-doped GaN and Ru-doped GaN. As illustrated in FIG. 2, the number of trap levels formed by Ru is greater than that formed by Fe by one. Fe forms two levels below the Fermi level and three levels above the Fermi level. In contrast, Ru forms three levels above the Fermi level and three levels below the Fermi level. This logically shows that similar to Fe, Ru forms many impurity levels in GaN and traps carriers, which allows the GaN layer to be an insulating layer.

Next, physical properties of actually obtained Ru-doped GaN will be described. In an experiment, crystal growth of Ru-doped GaN was performed by metal-organic chemical vapor deposition (MOCVD). As starting materials of Ga, Al, N, and Si, trimethylgallium ($Ga(CH_3)_3$, hereinafter referred to as TMG), trimethylaluminum ($Al(CH_3)_3$, hereinafter referred to as TMA), ammonia ($NH_3$), and silane ($SiH_4$) were respectively used. As a starting material of Ru, bis(ethyl cyclopentadienyl)ruthenium (($EtCp)_2Ru$) including Ru sandwiched between ethyl cyclopentadienyl (EtCp) groups was used. This starting material is yellow liquid (melting point 6° C.) at ambient temperatures. Moreover, ($EtCp)_2Ru$ has a thermal decomposition temperature of 400-460° C., and thus is a material which is sufficiently thermally decomposable at a growth temperature (1000° C. or higher) of GaN.

Figure 3:
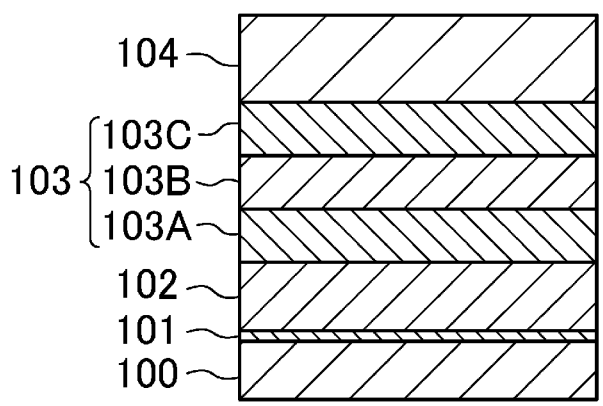
FIG. 3 is a cross-sectional view illustrating a sample used for evaluation of introduction controllability of transition metals.

A sample illustrated in FIG. 3 was formed, and the amount of Ru introduced into an underlying layer and the amount of Ru contaminating an upper layer were studied. The sample illustrated in FIG. 3 was formed by first performing crystal growth of an undoped GaN layer 102 to have a thickness of 0.5 μm on a low-temperature GaN buffer layer 101 having a thickness of 20 nm on a sapphire substrate 100 whose main surface was a (0001) plane, and then performing crystal growth of a Ru-doped layer 103 serving as a Ru-doped GaN layer. The Ru-doped layer 103 was composed of a first layer 103A, a second layer 103B, and a third layer 103C which are different from one another in Ru concentration. The first layer 103A, the second layer 103B, and the third layer 103C were each formed to have a thickness of 0.5 μm. A ($EtCp)_2Ru$ supply amount relative to a TMG supply amount was set to 5 ppm in the first layer 103A, 25 ppm in the second layer 103B, and 250 ppm in the third layer 103C. Then, supplying ($EtCp)_2Ru$ was stopped, and growth of an upper undoped GaN layer 104 was performed to have a thickness of 1 μm. Moreover, on a sapphire substrate, an underlying undoped GaN layer having a thickness of 0.3 μm, a Fe-doped GaN layer having a thickness of 1.0 μm, and an upper undoped GaN layer having a thickness of 1.7 μm were sequentially formed, thereby obtaining a first control sample. Note that a Fe supply amount relative to the TMG supply amount was set to 25 ppm.

Figure 4A:
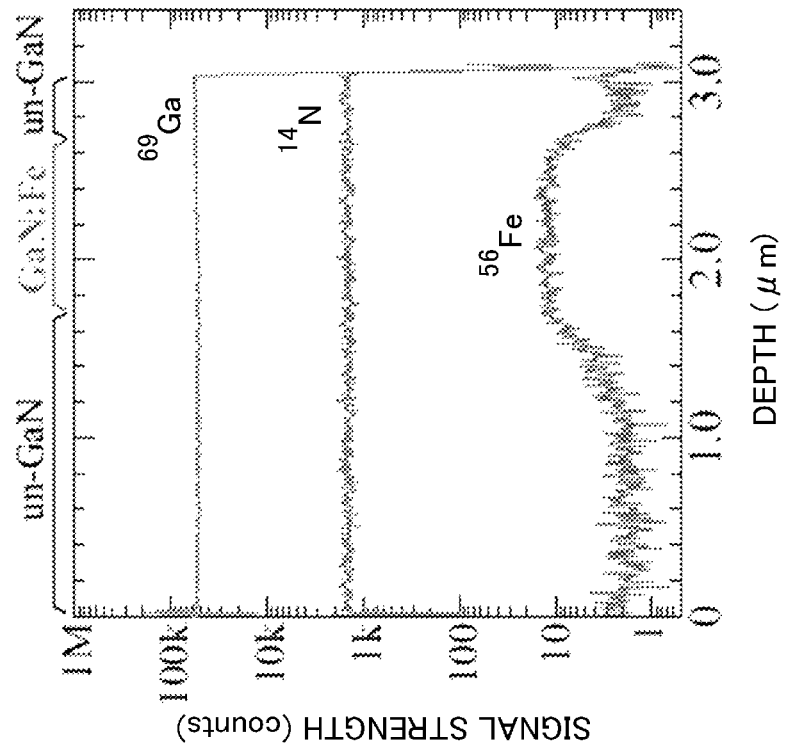
FIG. 4A is a view illustrating a result of an elementary analysis in a depth direction of the sample when ruthenium is introduced.
Figure 4B:
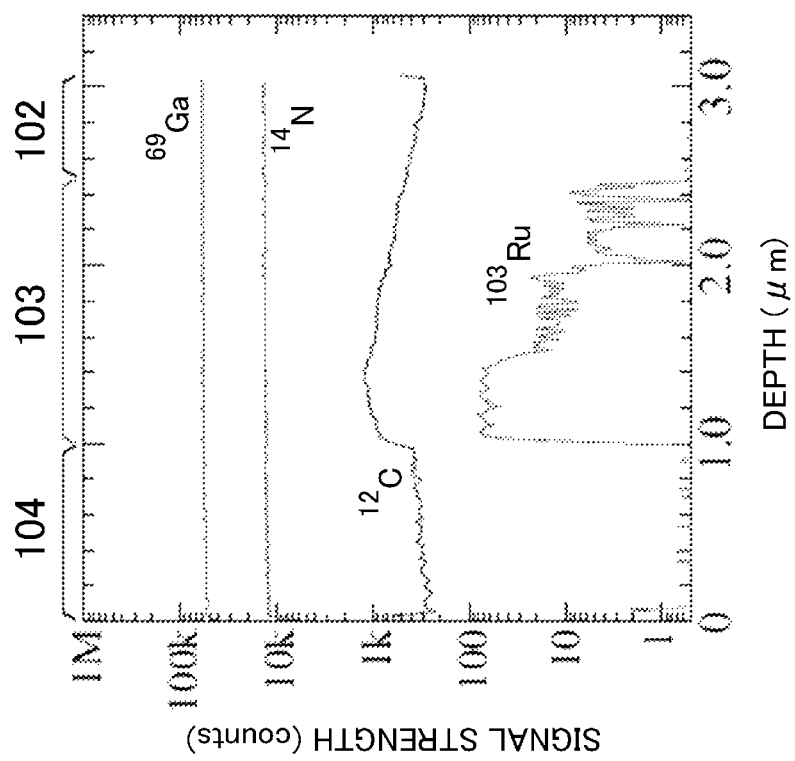
FIG. 4B is a view illustrating a result of the elementary analysis in a depth direction of the sample when Fe is introduced.

FIGS. 4A, 4B illustrate results of elementary analysis by secondary ion mass spectrometry (SIMS) in a depth direction respectively of the sample illustrated in FIG. 3 and of the first control sample. In FIG. 4A, in order to evaluate the amount of carbon contained in GaN from the Ru starting material containing a number of carbon (C) atoms, carbon concentration was also analyzed.

As illustrated in FIG. 4A, in the Ru-doped layer 103, Ru was detected, but the amount of Ru detected in the upper undoped GaN layer 104 was at a background level similar to that in the underlying undoped GaN layer 102. In contrast, as illustrated in FIG. 4B, in the case of the first control sample, Fe was diffused not only into the Fe-doped GaN (GaN:Fe) layer but also into the upper undoped GaN (un-GaN) layer. This shows that with Ru, only a target layer can be doped with high controllability, whereas Fe with which a target layer is doped also contaminates a layer formed on the target layer.

Moreover, in FIG. 4B, Fe at a background has a strength of about 2, and the strength is neither equal to nor lower than a detection limit. This is probably because of the influence of another experiment of Fe doping performed prior to the crystal growth of the first control sample, and because of diffusion of the Fe starting material adhered to pipes and an interior of a furnace since Fe is detected even after baking in a hydrogen atmosphere. In contrast, it was found that the Ru starting material did not have such influence, and upon stopping supplying the Ru starting material, the signal strength immediately decreased to or below the detection limit. As described above, it was also found that in doping with Fe, a MOCVD film forming device was significantly contaminated, whereas in doping with Ru, almost no contamination was found in the MOCVD film forming device.

FIG. 4A also shows increased carbon concentration in the Ru-doped layer 103. This is probably because mainly ethyl groups of $(EtCp)_2Ru$ are thermally decomposed to release carbon atoms, and the released carbon atoms are incorporated into the GaN layer. The carbon atoms form a trap level in the GaN layer, which can further increase the resistance of the Ru-doped GaN layer.

Figure 5:
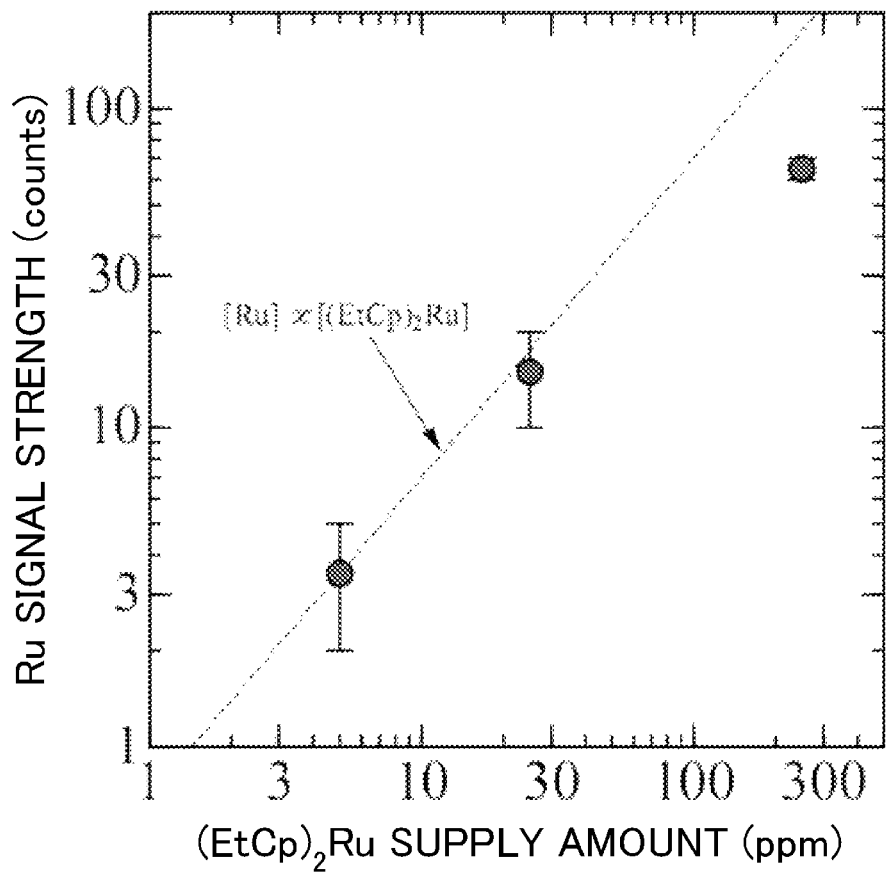
FIG. 5 is a graph illustrating the relationship between the amount of a supplied ruthenium starting material and the amount of introduced ruthenium.

FIG. 5 illustrates values detected by SIMS which are plotted with respect to a $(EtCp)_2Ru$ supply amount based on the result of FIG. 4A. In FIG. 5, the horizontal axis indicates the $(EtCp)_2Ru$ supply amount relative to the TMG supply amount, and the vertical axis indicates a count value measured by SIMS. Note that since there is no appropriate standard, conversion into the Ru concentration is not performed. As illustrated in FIG. 5, when the $(EtCp)_2Ru$ supply amount increases, the count value increases, and a significantly preferable linearity is kept up to a supply amount of 25 ppm. An increase in count value slows down at a flow rate of 250 ppm. This is probably because a rate of incorporating the starting material slows down due to a carrier gas at a high flow rate, and because of the influence of occurrence of a phase reaction. When a ratio of the gas flow rate to solid solution content of Ru corresponds to 1:1, this indicates that the GaN layer is doped with $1 \times 10^{18}$ cm$^{-3}$ of Ru at a supply amount of 25 ppm.

Figure 6A:
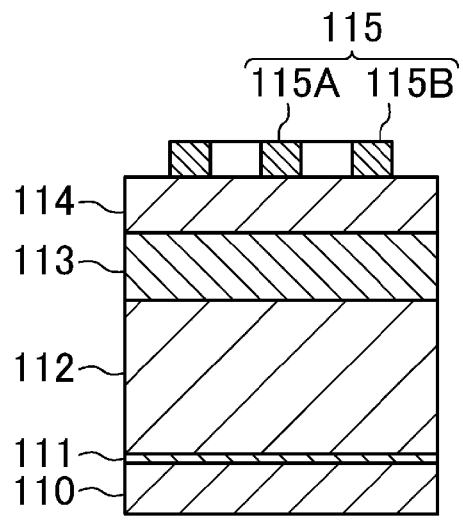
FIGS. 6A and 6B are cross-sectional views illustrating samples used for evaluation of leakage currents.
Figure 6B:
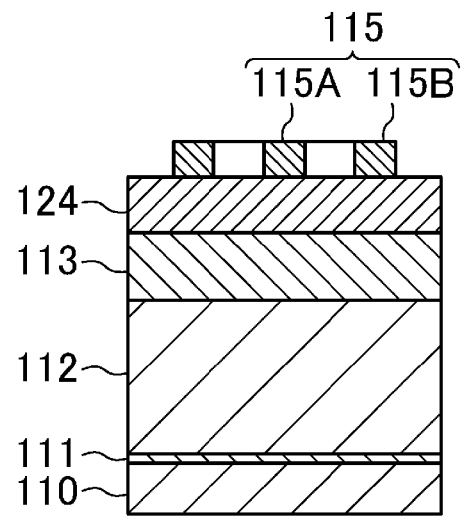

Next, using samples illustrated in FIGS. 6A and 6B, leakage currents were evaluated. The sample illustrated in FIG. 6A was formed by first performing crystal growth of an undoped GaN layer 112 to have a thickness of 2 µm on a buffer layer 111 on a sapphire substrate 110, and then performing crystal growth of an n-type GaN layer (having a doping concentration of $1 \times 10^{18}$ cm$^{-3}$) 113 having a thickness of 0.5 µm. After that, a Ru-doped layer 114 serving as a Ru-doped GaN layer was formed to have a thickness of 0.5 µm. A Ru supply amount r in forming the Ru-doped layer 114 was set to 25 ppm or 250 ppm relative to the TMG supply amount. The Ru-doped layer 114 was formed to be n type, and to have a carrier concentration of about $1 \times 10^{17}$ cm$^{-3}$. A reason for forming the Ru-doped layer 114 to be n type is to study a carrier trap effect by Ru doping, and to virtually reproduce a structure including a leakage current. On the Ru-doped layer 114, a transition linear model (TLM) pattern 115 was vapor deposited. Here, the TLM pattern was formed to have a circular shape, where the diameter of an inner circular electrode 115A was 200 µm, and the internal diameter of an outer ring-shaped electrode 115B was 300 µm. Thus, a gap having a width of 50 µm was provided between the circular electrode 115A and the ring-shaped electrode 115B. Note that as the circular electrode 115A and the ring-shaped electrode 115B, Ti/Al/Ti/Au electrodes capable of forming a preferable ohmic contact with the n-type GaN layer were used.

In the sample of FIG. 6B, a Ru-doped superlattice layer 124 serving as a superlattice layer was formed instead of the Ru-doped layer 114 made of GaN. The Ru-doped superlattice layer 124 was a multilayer structure in which 20 pairs of AlN layers each having a thickness of 5 nm and GaN layers each having a thickness of 20 nm were stacked. A Ru supply amount r in forming of the Ru-doped superlattice layer 124 was set to 5 ppm or 250 ppm relative to the TMG supply amount. The Ru-doped superlattice layer 124 was formed to be n type, and to have a carrier concentration of about $1 \times 10^{17}$ cm$^{-3}$. A reason for forming the Ru-doped superlattice layer 124 to be n type is the same as that for forming the Ru-doped layer 114 to be n type.

A second control sample and a third control sample respectively including a Ru-free layer and a Ru-free superlattice layer instead of the Ru-doped layer 114 and the Ru-doped superlattice layer 124 were formed.

Figure 7A:
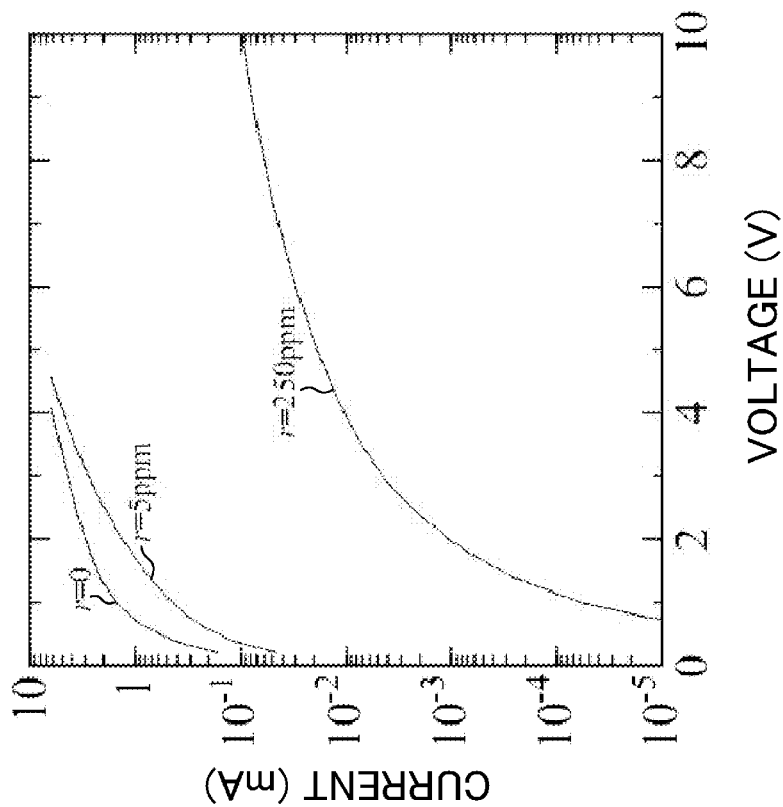
FIGS. 7A and 7B are graphs illustrating results of the evaluation of the leakage currents.
Figure 7B:
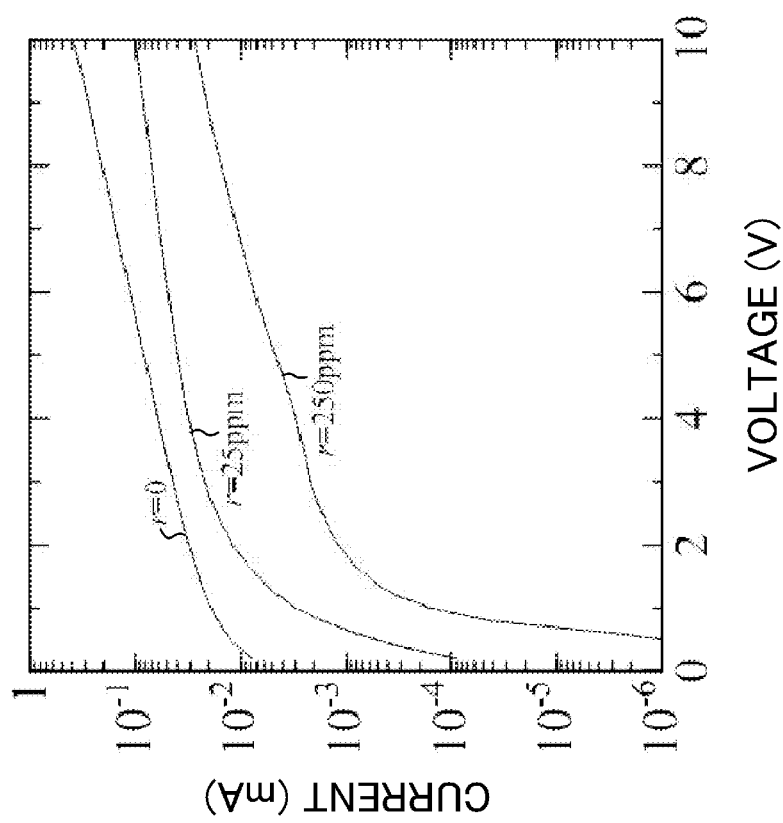

FIGS. 7A and 7B illustrate current-voltage (I-V) characteristics of the samples of FIGS. 6A and 6B, respectively. As illustrated in FIG. 7A, it can be seen that in the Ru-free second control sample (r=0), a current of about 0.1 mA flows due to n-type doping. As the doping amount of Ru increases, the leakage current decreases by at least one order. This is probably because of a trap level formed in GaN by Ru. In contrast, as illustrated in FIG. 7B, in the case of the superlattice layer, a current of higher than or equal to 1 mA, which is higher than that in the second control sample which is not a superlattice layer by about one order, flows in the Ru-free third control sample (r=0). This is because of carrier induction by polarization of an AlN/GaN superlattice structure in addition to the n-type doping. As the doping amount of Ru in the superlattice layer increases, the leakage current dramatically decreases, and in the case of an applied voltage of about 4 V, a decrease by about three orders compared to the third control sample can be seen.

It can be seen from the foregoing that when a nitride semiconductor layer is doped with Ru, composition controllability is very high, a film formation furnace is less likely to be contaminated, and a carrier trap effect is produced.

Although an example using Ru as a transition metal has been described, a similar advantage can be obtained as long as a transition metal has high composition controllability and is less likely to contaminate the film formation furnace. When doping with a transition metal is performed to allow a nitride semiconductor layer to be an insulating layer, it is preferable to form as many trap levels as possible due to d electrons within the forbidden band of the nitride semiconductor. When a trap level is unoccupied, an electron is trapped, whereas when a trap level is occupied, a positive hole is trapped. In order to exhibit insulating properties for both of the carriers, a half-and-half proportion of occupied trap levels and unoccupied trap levels is preferable. Thus, when doping with an element listed near the center in the periodic table illustrated in FIG. 8 is performed, there is the possibility of efficiently allowing the nitride semiconductor layer to be an insulating layer. Note that FIG. 8 shows transition metals of groups 3-12.

Among the elements shown in FIG. 8, elements which have a relatively small number of d electrons and are listed on the left have relatively small positive charges of atomic nuclei, and thus levels of the d electrons are located near a vacuum level. Thus, in the case of, for example, Ti, the Fermi level is located near a conduction band. Since an electron trapping level is formed between the Fermi level and the conduction band, a number of electron trapping levels cannot be formed when the Fermi level is located near the conduction band. In particular, group-3 transition metal elements having one d electron, such as Sc and Y, use all the d electrons to be bonded to nitrogen. Thus, the group-3 transition metal elements cannot form electron trapping levels, and exhibit no insulating property for the n type.

In contrast, Zn, Cd, Hg, etc. each include 10 d electrons which are all occupied, and thus d levels are each bound to the valence band, so that using such elements provides only a low degree of insulating properties. Cu, etc. has a very deep level of a d electron, and thus in contrast to Ti, etc., Cu forms the Fermi level near the valence band. Thus, it is possible to increase the number of electron trapping levels. However, positive hole trapping levels are formed between the Fermi level and the valence band. Thus, when an energy difference between the Fermi level and the valence band is small, a sufficient number of positive hole trapping levels cannot be obtained. When a superlattice layer is doped with a transition metal, the superlattice layer generates electrons and positive holes. For this reason, it is not preferable that the Fermi level be located near the valence band.

In view of the foregoing, elements which are effective for allowing the nitride semiconductor layer to be an insulating layer are limited to the elements of groups 7-11. Among these elements, Tc is radioactive, and has no stable isotope. Moreover, as described above, Fe has low composition controllability. Thus, among the elements of groups 7-11, Ru, Co, Ni, Os, Rh, and Ir are preferable.

Moreover, for efficient doping with the nitride semiconductor, it is preferable that organometallic compounds which can be used in MOCVD be available. Elements including metallocene compounds among the organometallic compounds are preferable, and Ni, Co, Ru, and Os are more preferable. Ru and Os are much more preferable since high-purity metallocene compounds are easily obtained. In particular, since Ru is used as a capacitor electrode of a dynamic random access memory (DRAM), etc., Ru has an advantage that various metallocene compounds different in physical properties, such as vapor pressure, can easily be obtained.

Figure 9A:
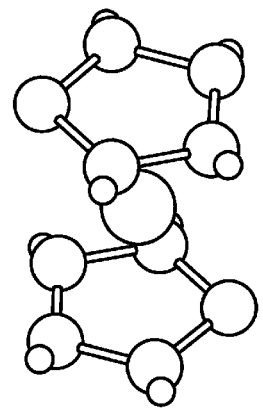
FIGS. 9A and 9B are views respectively illustrating a structure and a charge state of bis(cyclopentadienyl)ruthenium.
Figure 9B:
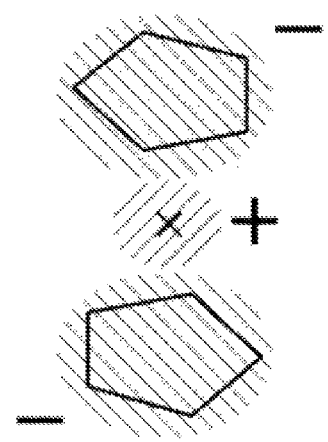

Design of the melting point and the vapor pressure of the Ru starting material is considered in terms of a molecular structure. In the case of bis(cyclopentadienyl)ruthenium ($Cp_2Ru$) including no ethyl group as illustrated in FIG. 9A, charges of cyclopentadienyl groups are distributed to be negative, and a charge of ruthenium is distributed to be positive as illustrated in FIG. 9B. In such charge distribution, the negatively charged cyclopentadienyl groups of other molecules are easily attracted to the positively charged ruthenium by electrostatic force. The attracted $Cp_2Ru$ molecules are more likely to align in a regular array, so that the $Cp_2Ru$ molecules easily condense as a crystal. Actually, $Cp_2Ru$ has a very high melting point of 195° C.-200° C., and a very low vapor pressure. Thus, $Cp_2Ru$ is very difficult to handle as a starting material in MOCVD.

Figure 10A:
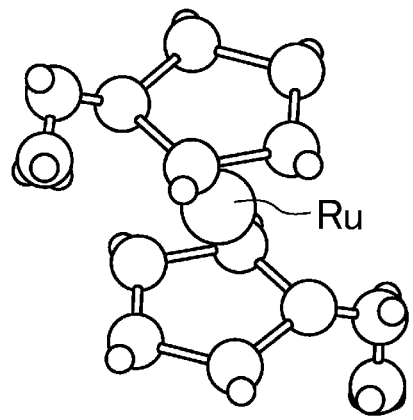
FIGS. 10A and 10B are views respectively illustrating a structure and a charge state of bis(ethyl cyclopentadienyl) ruthenium.
Figure 10B:
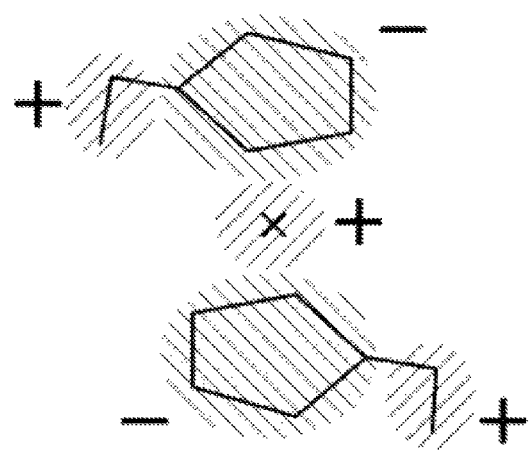
Figure 11A:
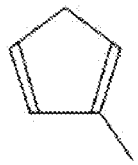
FIGS. 11A-11F are structural formulae of cyclopentadienyl compounds having alkyl side chains.
Figure 11B:
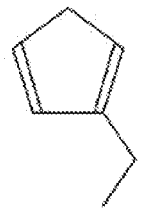
Figure 11C:
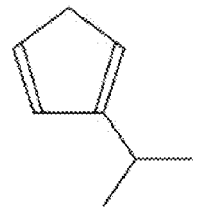
Figure 11D:
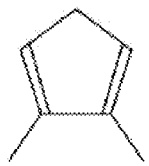
Figure 11E:
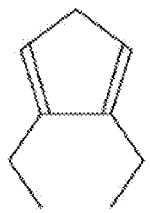
Figure 11F:
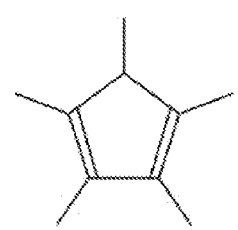

In contrast, $(EtCp)_2Ru$ includes ethyl groups as illustrated in FIG. 10A, and has charge distribution as illustrated in FIG. 10B. Similar to the case of $Cp_2Ru$, $(EtCp)_2Ru$ also has charges of cyclopentadienyl groups distributed to be negative, and a charge of ruthenium distributed to be positive. Thus, the negatively charged cyclopentadienyl groups of other molecules are attracted to the positively charged ruthenium. However, the ethyl groups of side chains of $(EtCp)_2Ru$ supply charges to the cyclopentadienyl groups, and thus are positively charged. $(EtCp)_2Ru$ having positively charged ethyl groups of the side chains is less likely to be attracted to ruthenium compared to $Cp_2Ru$, and thus is less likely to condense. Moreover, the ethyl groups of the side chains have rotational degrees of freedom, and the ethyl groups of the side chains continuously vibrate due to heat. The vibrating ethyl groups of the side chains cause steric inhibition at the time of condensation. For the reasons described above, $(EtCp)_2Ru$ has a significantly low melting point compared to $Cp_2Ru$, as a result of which $(EtCp)_2Ru$ can be in a liquid state even at room temperatures. Pipes of a film forming device have a temperature of about 50° C., and thus a starting material supplying a transition metal is preferably in a liquid state at the above-described temperature. Thus, using a metallocene transition metal starting material having a melting point of lower than 50° C. can significantly reduce adhesion of the transition metal to pipes and sidewalls of a reaction furnace, so that it is possible to improve doping controllability.

Moreover, $(EtCp)_2Ru$ has weak intermolecular attractive force, so that the vapor pressure of $(EtCp)_2Ru$ is much higher than that of $Cp_2Ru$. In the metallocene transition metal starting material, adding an alkyl side chain to a cyclopentadienyl group is very important in controlling the vapor pressure. As further described below, there is an advantage that thermal decomposition of the side chain can increase the concentration of carbon in a film.

Alternatively, a metallocene compound including a cyclopentadienyl group having an alkyl side chain other than $(EtCp)_2Ru$ may be used. For example, a metallocene compound including a methyl cyclopentadienyl group, an ethyl cyclopentadienyl group, an isopropyl cyclopentadienyl group, a dimethyl cyclopentadienyl group, a diethyl cyclopentadienyl group, a pentamethyl cyclopentadienyl group, etc. illustrated in FIGS. 11A-11F can be used. For this purpose, a total number of carbon atoms of an alkyl side chain is preferably two or more. If the number of carbon atoms of the alkyl side chain is one or less, the alkyl side chain is insufficient to reduce the melting point and to increase the vapor pressure. The alkyl side chain is preferably composed of at least one ethyl group or at least two methyl groups. This is a molecular size necessary to inhibit a stereo configuration, and in particular, in 4 d transition metals, the molecular weight is preferably even larger.

Figure 12:
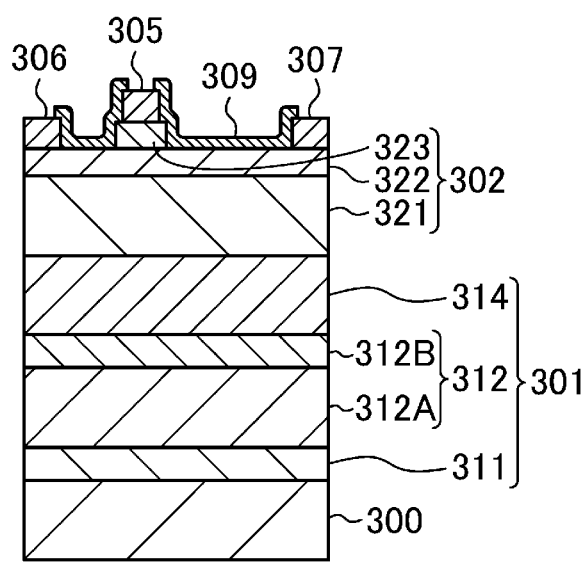
FIG. 12 is a cross-sectional view illustrating an example transistor.

Next, a specific example of a transistor will be described. FIG. 12 illustrates a specific example of a transistor. On a Si substrate 300 whose main surface is a (111) plane, an underlying layer 301 and a first layer (for example, including an operation layer 302) are formed. The underlying layer 301 is a multilayer structure composed of a buffer layer 311 made of AlN having a thickness of 300 nm, an AlGaN layer 312, and a Ru-doped superlattice layer 314 which are formed in this order on the Si substrate 300. The AlGaN layer 312 includes a first AlGaN layer 312A made of $Al_{0.25}Ga_{0.75}N$ and having a thickness of 400 nm, and a second AlGaN layer 312B made of Ru-doped $Al_{0.25}Ga_{0.75}N$ and having a thickness of 100 nm. The second AlGaN layer 312B is a transition-metal-doped layer which is doped with a transition metal. The superlattice layer 314 includes alternately stacked first layers and second layers having a higher lattice constant than the first layers. Specifically, the superlattice layer 314 is a multilayer structure including 25 cycles of alternately stacked Ru-doped first layers each made of AlN having a thickness of 5 nm, and undoped second layers each made of GaN having a thickness of 15 nm. The first layers are also transition-metal-doped layers which are doped with a transition metal. In the case of the configuration of the example, among the layers included in the underlying layer 301, the superlattice layer 314 is a layer which is most strongly polarized.

The operation layer 302 includes: a channel layer 321 made of undoped GaN and having a thickness of 1 μm; a cap layer 322 made of $Al_{0.25}Ga_{0.75}N$, having a thickness of 25 nm, and formed on the channel layer 321; and a p-type layer 323 made of p-type GaN, having a thickness of 200 nm, and selectively formed on the cap layer 322. The p-type layer 323 is doped with Mg, and the concentration of Mg is $1\times10^{19}$ $cm^{-3}$.

On the p-type layer 323, a gate electrode 305 made of Ni/Pt/Au is formed. On both sides of the p-type layer 323, a source electrode 306 and a drain electrode 307 which are made of Ti/Au are formed. A protective film 309 made of SiN is formed to cover exposed portions of the cap layer 322.

The buffer layer 311 is provided for the purpose of preventing a compound forming reaction at the interface between the Si substrate 300 and the Ga containing layer above the buffer layer 311. The AlGaN layer 312 is formed to improve strain balance of a layer structure. When crystal growth of the AlGaN layer 312 having a large lattice constant is performed on the buffer layer 311, compression strain is applied to the AlGaN layer 312. In contrast, as the thickness of the AlGaN layer 312 increases, tensile strain is applied to the buffer layer 311. When the tensile strain is strongly applied, the layer structure has a bow which is convex relative to a growth surface. Here, force by which the Si substrate 300 recovers its horizontal state continuously applies the compression strain to the upper layer, so that the occurrence of cracks caused by the tensile strain can be avoided. However, when the thickness of the AlGaN layer 312 is larger than or equal to several hundred nanometers, strain relaxation occurs in the AlGaN layer 312. Therefore, the convex bow can no longer be retained, and in turn, the layer structure tends to have a concave bow. In the example transistor, the superlattice layer 314 is provided so that the bow is convex again. The superlattice layer 314 is a multilayer structure formed by alternately stacking first layers made of AlN which are very hard and in which dislocation is more likely to occur and second layers made of GaN which are soft and are easily flattened. Thus, overall strain balance is adjusted, and adjustments are made so that a concave bow in which cracks easily occur is not caused. The channel layer 321 made of GaN formed on the superlattice layer 314 has a lattice constant which is larger than an average lattice constant of the superlattice layer 314. Therefore, similar to the relationship between the buffer layer 311 and the AlGaN layer 312, a bow which is convex upward is caused again by the compression strain. This can prevent the occurrence of cracks in the channel layer 321.

Due to polarization by the cap layer 322, two-dimensional electron gas is more likely to be accumulated in an uppermost portion of the channel layer 321, and the portion serves as a channel in which electrons move. The channel layer 321 has a relatively large thickness to ensure a distance relative to the second AlGaN layer 312B and the superlattice layer 314 which contain Ru. Moreover, the p-type layer 323 is provided to elevate a conduction band when no electric field is applied. Thus, it is possible to obtain a so-called normally off transistor in which a drain current does not flow even in the case of a gate voltage of 0 V.

Figure 13A:
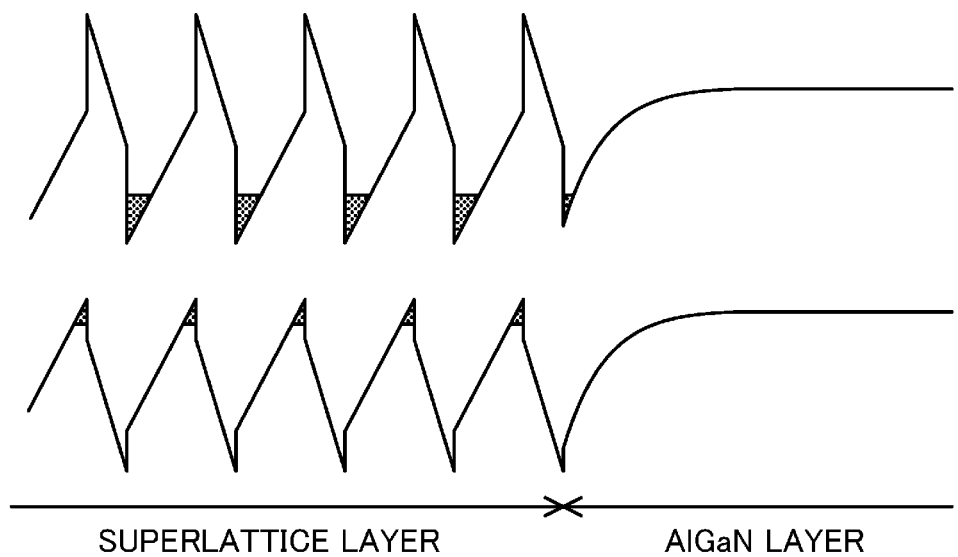
FIG. 13A is a view illustrating a band structure of an undoped superlattice layer.

Since the AlN/GaN superlattice structure is very strongly polarized, electrons and positive holes are induced at each of interfaces between sub-layers in the superlattice layer as illustrated in FIG. 13A when the superlattice layer is not doped with Ru. A difference between lattice constants of AlN and GaN is very large, and thus many defects present at an interface between the AlN layer and the GaN layer. The defects form trap levels, but electrons or positive holes are also simultaneously generated. In particular, when a level is shallow, and is capable of being thermally excited, electrons or positive holes are excited in a conduction band or a valence band, which contributes to electric conduction. As described above, the superlattice structure is a structure into which carriers are easily induced, and as illustrated in FIG. 13A, in particular, electrons are easily induced. Moreover, at an interface between the lowermost AlN layer of the superlattice layer and the AlGaN layer under the lowermost AlN layer, carriers due to a polarization difference are easily induced. As described above, in a nitride semiconductor, carriers are induced at an interface between layers having different polarization properties, and thus a breakdown voltage decreases in the multilayer structure. Therefore, in order to increase the breakdown voltage, the thickness of a channel layer has to be increased.

On the other hand, in the example transistor, the superlattice layer 314 and the second AlGaN layer 312B under the superlattice layer 314 are doped with Ru. Specifically, the first layer made of AlN is doped with Ru so that the concentration of Ru is about $1 \times 10^{19}$ cm$^{-3}$, and the second AlGaN layer 312B is doped with Ru so that the concentration of Ru is about $1 \times 10^{18}$ cm$^{-3}$. The second AlGaN layer 312B has a wide band gap, and thus can sufficiently capture carries even with a relatively small doping amount of $1 \times 10^{18}$ cm$^{-3}$. In contrast, the doping amount of the superlattice layer 314 is increased by one order so that carrier induction effects due to polarization and defects can completely be canceled. According to our computation results, Ru forms three acceptor levels per one atom. Thus, when a Ru doping amount is $1 \times 10^{19}$ cm$^{-3}$, $3 \times 10^{19}$ cm$^{-3}$ electrons can be captured. Moreover, when crystal growth of a Ru-doped layer is performed by the example method, the Ru-doped layer is inevitably doped with carbon, which can further promote electron trapping.

Figure 13B:
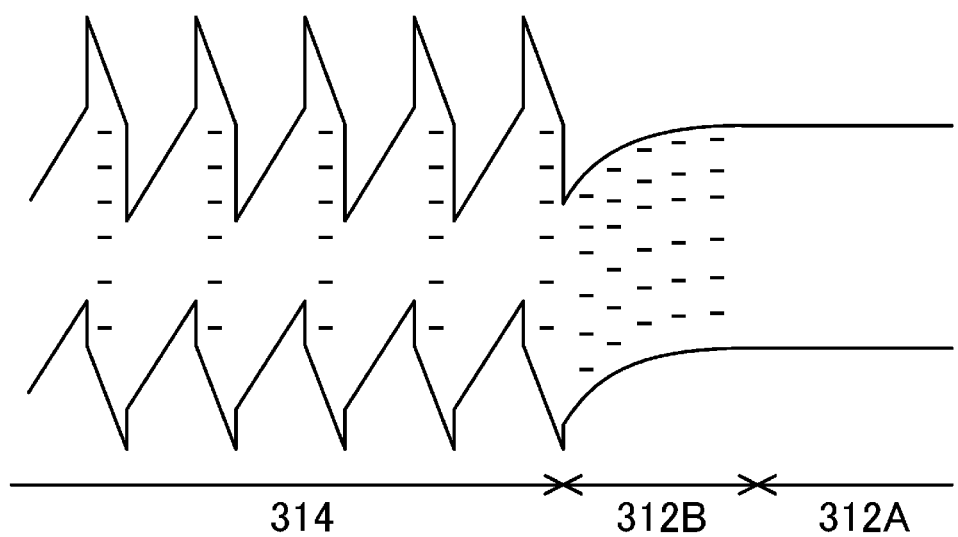
FIG. 13B is a view illustrating a band structure of a ruthenium-doped superlattice layer.

The first layer made of AlN receives tensile strain in its surface, and the second layer made of GaN receives compression strain. The ion radius of Ru is 0.67 Å even with a valence of +4 at which the ion radius is minimum, whereas the ion radius of Al with a valence of +3 and the ion radius Ga with a valence of +3 are respectively as small as 0.51 Å and 0.63 Å. Thus, when Ru substitutes for a Group-III atom in a nitride semiconductor, the lattice constant of a host material increases. Thus, Ru which can reduce the amount of strain can more stably be present in the first layer made of AlN to which the tensile strain is applied than in the second layer made of GaN to which the compression strain is applied. Electrons and positive holes are accumulated in the second layer made of GaN having a narrower band gap. However, electrons and positive holes are trapped in an impurity level resulting from Ru, with which the first layer made of AlN is doped, due to penetration of a wave function. Thus, as illustrated in FIG. 13B, no carrier remains in the conduction band and the valence band. Therefore, the superlattice layer 314 and the second AlGaN layer 312B under the superlattice layer 314 serve as a preferable insulator, and electric fields are applied to the superlattice layer 314 and the second AlGaN layer 312B in applying a high voltage. As a result, the underlying layer is allowed to be an insulating layer, and can contribute to increase a breakdown voltage, so that it becomes easy to obtain an element having a further increased breakdown voltage.

Figure 14:
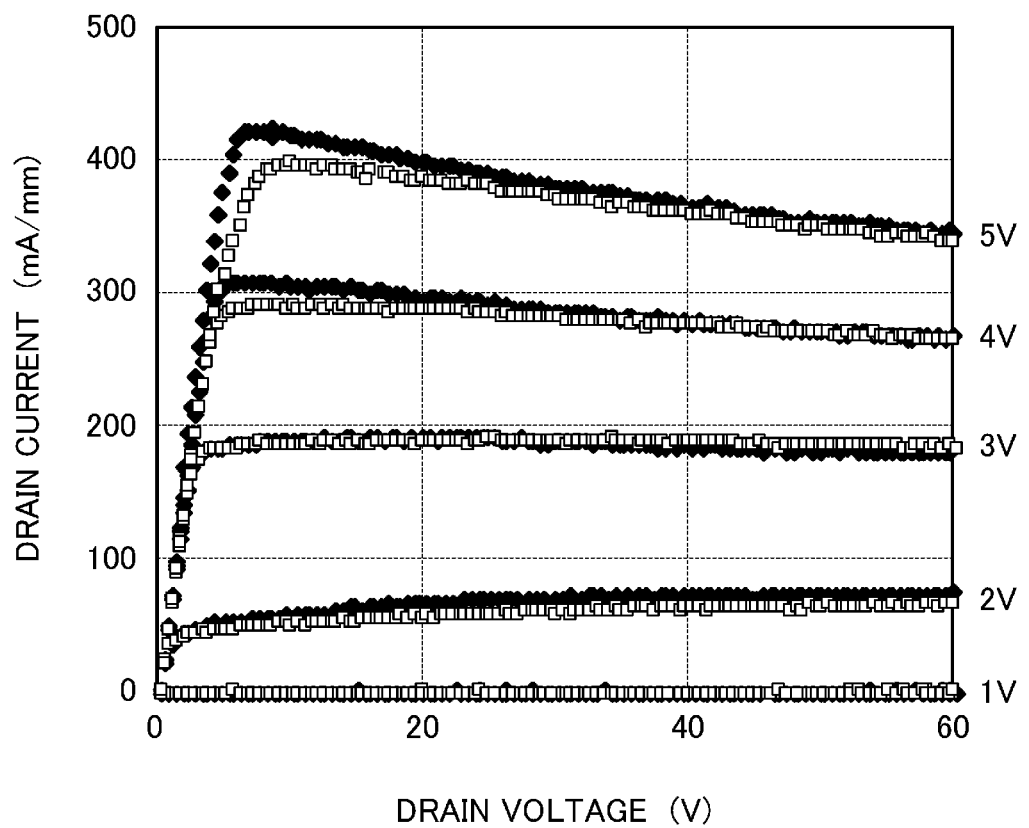
FIG. 14 is a view illustrating current-voltage characteristics of the example transistor.

FIG. 14 illustrates voltage-current characteristics of the example transistor. In FIG. 14, the horizontal axis indicates drain voltages Vds, and the vertical axis indicates drain currents Id. A predetermined gate voltage was applied, and the characteristics before and after application of a high voltage were measured. In the figure, plots shown by black diamonds (◆) are the characteristics before the application of the high voltage, and plots shown by white squares (☐) are the characteristics after the application of the high voltage.

When Ru contaminates the first layer (for example, including the operation layer), drain current modulation occurs due to trapping of carries. However, as illustrated in FIG. 14, in the example transistor, on-resistance shows little change before and after the application of the high voltage. Note that the on-resistance is defined by the following expression: (drain voltage in a low drain-voltage range (0 to several volts))÷(drain current). This shows that with Ru, only the underlying layer is doped with high controllability, and that Ru does not contaminate the first layer (for example, including the operation layer). Moreover, the result of the measurement showed that the breakdown voltage between the source and the drain with a gate voltage of 0 V was 400 V or higher. In contrast, conventional transistors which were not doped with Ru had a breakdown voltage of 220 V. This shows that when the superlattice layer 314 and the second AlGaN layer 312B are doped with Ru, carries are effectively trapped, and the underlying layer is allowed to be an insulating layer.

Figure 15A:
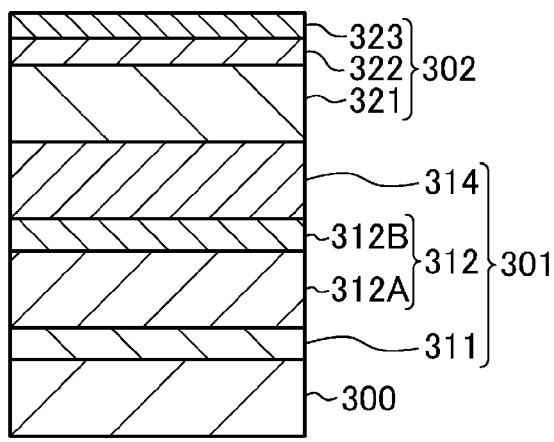
FIGS. 15A-15D are cross-sectional views sequentially illustrating processes in a method for fabricating the example transistor.

A method for fabricating the example transistor will be described below. First, as illustrated in FIG. 15A, crystal growth of an underlying layer 301 and a first layer (for example, including an operation layer 302) is performed on a Si substrate 300 by MOCVD. The underlying layer 301 may be formed by sequentially forming a buffer layer 311 made of AlN having a thickness of 300 nm, an AlGaN layer 312, and a Ru-doped superlattice layer 314. To dope with Ru, $(EtCp)_2Ru$ may be used. Moreover, as described above, other metallocene compounds may be used. The superlattice layer 314 may be a multilayer structure including 25 cycles of alternately stacked first layers made of Ru-doped AlN and having a thickness of 5 nm, and second layers made of undoped GaN and having a thickness of 15 nm. A layer provided above the underlying layer is not doped with Ru. The operation layer 302 may be formed by sequentially forming a channel layer 321 made of undoped GaN and having a thickness of 1 μm, a cap layer 322 made of $Al_{0.25}Ga_{0.75}N$ and having a thickness of 25 nm, and a p-type layer 323 made of p-type GaN and having a thickness of 200 nm. As a Mg dopant for forming the p-type layer 323, bis(cyclopentadienyl)magnesium ($Cp_2Mg$) may be used, and the concentration of the Mg dopant may be $1\times10^{19}$ $cm^{-3}$.

Figure 15B:
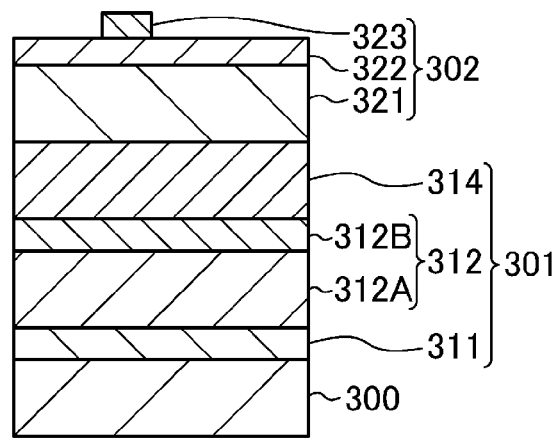

Next, as illustrated in FIG. 15B, the p-type layer 323 is selectively removed by photolithography and dry etching using chlorine. Dry etching conditions are such that the chlorine flow rate is 10 sccm, the back pressure is 10 Pa, and the RF power is 100 W.

Figure 15C:
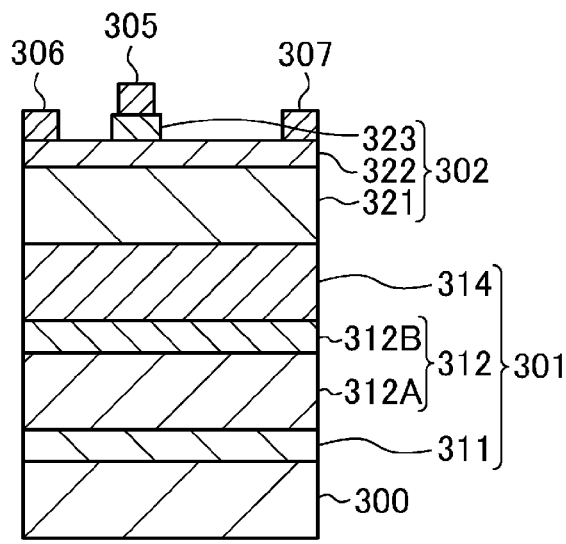

Next, as illustrated in FIG. 15C, electrodes are formed by vapor deposition. A source electrode 306 and a drain electrode 307 may use Ti/Au forming a preferable ohmic contact with an n-type or electron-excessive portion. A gate electrode 305 may use Ni/Pt/Au forming a preferable ohmic contact with a p-type semiconductor region.

Figure 15D:
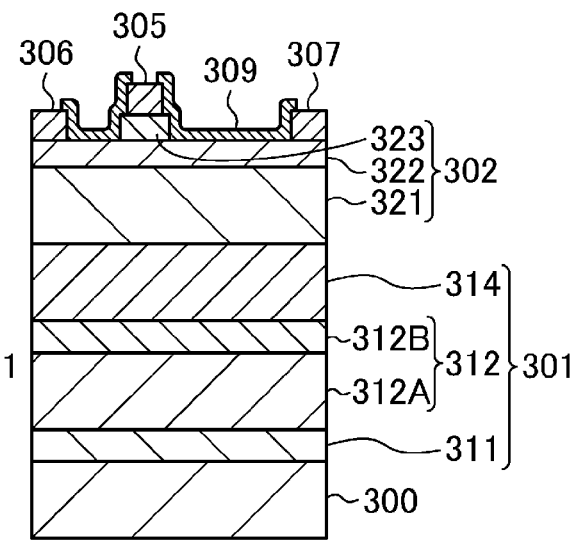

Next, as illustrated in FIG. 15D, a protective film 309 made of SiN is formed by thermal CVD. Then, selective etching is performed so that the gate electrode 305, the source electrode 306, and the drain electrode 307 are exposed.

The example in which only the first layer made of AlN of the superlattice layer 314 is doped with Ru has been described. However, when strain, or the like is maintained in an acceptable range, the second layer made of GaN may also be doped with Ru. Although the superlattice layer in which one cycle includes a first layer and a second layer has been described, a superlattice layer in which one cycle includes three or more layers may be used. Moreover, a composition-graded region in which a composition is graded may be provided between the layers. When the composition-graded regions are provided, it is possible to obtain the advantage of increasing design freedom of the superlattice layer. Although the example in which only the superlattice layer 314 and the second AlGaN layer 312B are doped with Ru has been described, other layers included in the underlying layer such as the first AlGaN layer 312A, the buffer layer 311, etc. may be doped with Ru. When the number of Ru-doped layers is increased, it is possible to increase the resistance of the underlying layer 301, so that a transistor having a higher breakdown voltage can be obtained. Note that it is important to keep a sufficiently large distance between a Ru-doped layer and a region in which electrons move. Although the example in which the superlattice layer is used to control strain has been described, a Ru-doped single composition layer may be used instead of the superlattice layer when no problem of the strain occurs.

The transition metal with which the underlying layer is doped may be Co, Ni, Os, Rh, Ir, or the like instead of Ru. Moreover, the transition metal for use in doping is not necessarily one type, but two or more of the above-listed metals may be used.

The transistor including the gate electrode formed on the p-type semiconductor layer has been described. However, the gate electrode may form a Schottky contact with the cap layer. Alternatively, a gate insulating film may be provided between the gate electrode and the cap layer. Alternatively, the configuration of the first layer (for example, including the operation layer) may be accordingly changed. Although the example in which the substrate is a Si substrate has been described, other substrates such as sapphire substrates, etc. may be used.

The transistor and the method for fabricating the same according to the present disclosure can provide a transistor including an underlying layer which has small influence on an operation layer and improved insulating properties, and are particularly useful for transistors made of nitride and having high breakdown voltage and methods for fabricating the same.

What is claimed is:

1. A transistor comprising:
   a substrate;
   an underlying layer formed on the substrate; and
   a first layer made of a nitride semiconductor formed on the underlying layer, wherein:
   the underlying layer is a multilayer structure including a plurality of stacked nitride semiconductor layers,
   the underlying layer includes an AlGaN layer doped with at least one of cobalt, nickel, ruthenium, osmium, rhodium, or iridium, as a first transition metal and a superlattice layer doped with at least one of cobalt, nickel, ruthenium, osmium, rhodium, or iridium, as a second transition metal, and
   the superlattice layer is an insulating layer.

2. The transistor of claim 1, wherein
   the superlattice layer is disposed on the AlGaN layer.

3. The transistor of claim 1, wherein
   the superlattice layer includes an AlN layer and a GaN layer, and is a most strongly polarized layer in the multilayered structure.

4. The transistor of claim 1, wherein
   a layer in contact with an under surface of the superlattice layer contains the second transition metal within at least 0.1 μm from the under surface.

5. The transistor of claim 1, wherein
   a sub-layer of the superlattice layer which has a first lattice constant contains the second transition metal,
   a sub-layer of the superlattice layer which has a second lattice constant is free of the second transition metal, and
   the second lattice constant is larger than the first lattice constant.

6. The transistor of claim 1, wherein
   the multilayer structure has an interface formed by two of the nitride semiconductor layers having different polarization properties, and
   one of the two layers forming the interface is the AlGaN layer.

7. The transistor of claim 1, wherein
   the AlGaN layer is a most strongly polarized layer in the multilayer structure.

8. The transistor of claim 1, wherein
   the AlGaN layer has a higher carbon content than the other layers in the multilayer structure.

9. The transistor of claim 1, wherein
   a layer provided above the AlGaN layer is free of the first transition metal.

10. The transistor of claim 1, wherein
the first transition metal is introduced into the AlGaN layer from a metallocene compound,
the metallocene compound has a structure sandwiching the first transition metal between two pairs of cyclopentadienyl groups including an alkyl side chain, and
the alkyl side chain includes two or more carbon atoms.

11. The transistor of claim 1, wherein
the first layer is composed of an operation layer.

12. The transistor of claim 1, further comprising:
a gate electrode, a source electrode and a drain electrode disposed on the first layer respectively,
wherein the gate electrode is disposed between the source electrode and the drain electrode.

13. The transistor of claim 12, further comprising:
a protective film which partially covers both an upper surface of the source electrode and an upper surface of the drain electrode.

14. The transistor of claim 12, further comprising:
a protective film which partially covers an upper surface of the gate electrode.

15. The transistor of claim 12, wherein:
the first layer includes a channel layer disposed on the underlying layer, a cap layer disposed on the channel layer and a p-type layer disposed on the cap layer,
the gate electrode is disposed on the p-type layer, and
the source electrode and the drain electrode are disposed on the cap layer.

16. The transistor of claim 1, wherein
the first transition metal is the same as the second transition metal.

17. The transistor of claim 1, wherein
the AlGaN layer is an insulating layer.

18. The transistor of claim 1, wherein
the superlattice layer does not emit light.

* * * * *